United States Patent
Moens et al.

(10) Patent No.: US 9,543,291 B2
(45) Date of Patent: Jan. 10, 2017

(54) METHOD OF FORMING A HIGH ELECTRON MOBILITY SEMICONDUCTOR DEVICE AND STRUCTURE THEREFOR

(71) Applicant: SEMICONDUCTOR COMPONENTS INDUSTRIES, LLC, Phoenix, AZ (US)

(72) Inventors: Peter Moens, Zottegem (BE); Jaume Roig Guitart, Oudenaarde (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/989,370

(22) Filed: Jan. 6, 2016

(65) Prior Publication Data

US 2016/0118377 A1    Apr. 28, 2016

Related U.S. Application Data

(62) Division of application No. 14/182,508, filed on Feb. 18, 2014, now Pat. No. 9,269,789.

(Continued)

(51) Int. Cl.
*H01L 27/06* (2006.01)
*H01L 29/205* (2006.01)
(Continued)

(52) U.S. Cl.
CPC ....... *H01L 27/0617* (2013.01); *H01L 21/8252* (2013.01); *H01L 23/3107* (2013.01); *H01L 23/49503* (2013.01); *H01L 23/49562* (2013.01); *H01L 23/49575* (2013.01); *H01L 27/0605* (2013.01); *H01L 29/205* (2013.01); *H01L 29/407* (2013.01); *H01L 29/4175* (2013.01); *H01L 29/4236* (2013.01); *H01L 29/66431* (2013.01); *H01L 29/66462* (2013.01); *H01L 29/7786* (2013.01); *H01L 29/7787* (2013.01); *H01L 29/7788* (2013.01); *H01L 29/7827* (2013.01); *H01L 29/872* (2013.01); *H01L 29/1087* (2013.01); *H01L 29/2003* (2013.01); *H01L 29/41766* (2013.01);

(Continued)

(58) Field of Classification Search
CPC ............ H01L 27/0617; H01L 27/0605; H01L 21/8252; H01L 23/49503; H01L 23/3107; H01L 23/495652; H01L 29/2003; H01L 29/205; H01L 29/4236; H01L 29/66431; H01L 29/66462; H01L 29/7787; H01L 29/7788; H01L 29/7827

See application file for complete search history.

(56) References Cited

U.S. PATENT DOCUMENTS

| 2007/0132037 A1 | 6/2007 | Hoshi et al. |
| 2007/0176201 A1 | 8/2007 | Beach et al. |
| 2011/0210338 A1 | 9/2011 | Briere |

OTHER PUBLICATIONS

Hidekazu Umeda et al., Blocking-Voltage Boosting Technology for GaN Transistors by Widening Depletion Layer in Si Substrates, 2010, IEEE.

(Continued)

*Primary Examiner* — Whitney T Moore
(74) *Attorney, Agent, or Firm* — Kevin B. Jackson

(57) ABSTRACT

In one embodiment, a method of forming a semiconductor device can comprise; forming a HEM device on a semiconductor substrate. The semiconductor substrate provides a current carrying electrode for the semiconductor device and one or more internal conductor structures provide a vertical current path between the semiconductor substrate and regions of the HEM device.

19 Claims, 9 Drawing Sheets

Related U.S. Application Data

(60) Provisional application No. 61/786,596, filed on Mar. 15, 2013.

(51) Int. Cl.
  *H01L 29/78* (2006.01)
  *H01L 29/778* (2006.01)
  *H01L 29/423* (2006.01)
  *H01L 29/20* (2006.01)
  *H01L 23/31* (2006.01)
  *H01L 23/495* (2006.01)
  *H01L 29/66* (2006.01)
  *H01L 21/8252* (2006.01)
  *H01L 29/40* (2006.01)
  *H01L 29/417* (2006.01)
  *H01L 29/872* (2006.01)
  *H01L 29/10* (2006.01)

(52) U.S. Cl.
  CPC  *H01L 29/41775* (2013.01); *H01L 2224/0603* (2013.01); *H01L 2224/48247* (2013.01); *H01L 2924/12032* (2013.01); *H01L 2924/1305* (2013.01); *H01L 2924/13091* (2013.01)

(56) References Cited

OTHER PUBLICATIONS

Yasuhiro Uemoto et al., 8300V Blocking Voltage AlGaN/GaN Power HFET with Thick Poly-AlN Passivation, 861, 2007, IEEE.

METHOD OF FORMING A HIGH ELECTRON MOBILITY SEMICONDUCTOR DEVICE AND STRUCTURE THEREFOR

CROSS-REFERENCE TO RELATED APPLICATIONS

The present application is a divisional application of U.S. patent application Ser. No. 14/182,508, filed on Feb. 18, 2014, and issued as U.S. Pat. No. 9,269,789 on Feb. 23, 2016, which claims the benefit of U.S. Provisional Application No. 61/786,596 filed Mar. 15, 2013, both of which are hereby incorporated by reference, and priority thereto is hereby claimed.

BACKGROUND OF THE DISCLOSURE

The present invention relates, in general, to electronics, and more particularly, to semiconductors, structures thereof, and methods of forming semiconductor devices.

In the past, the semiconductor industry utilized various methods to form power semiconductor devices that used at least one III series semiconductor material, such as gallium nitride (GaN), as one of the semiconductor materials. Such power semiconductor devices were used in a variety of applications including power supplies and motor controllers including high voltage switching circuits. GaN power semiconductor devices built on silicon substrates, such as high electron mobility transistor ("HEMT") devices, have been lateral devices with both the source and drain electrodes on the top surface of the device. However, this configuration made it difficult to form connections to various portions of the semiconductor devices. It also was difficult to package the GaN devices with silicon metal-oxide-semiconductor (MOS) transistors.

Accordingly, it is desirable to have a semiconductor device using GaN or other III series materials such as a III-nitride series material or SiC that has improved device connectability as well as integration capability.

Figure 1:
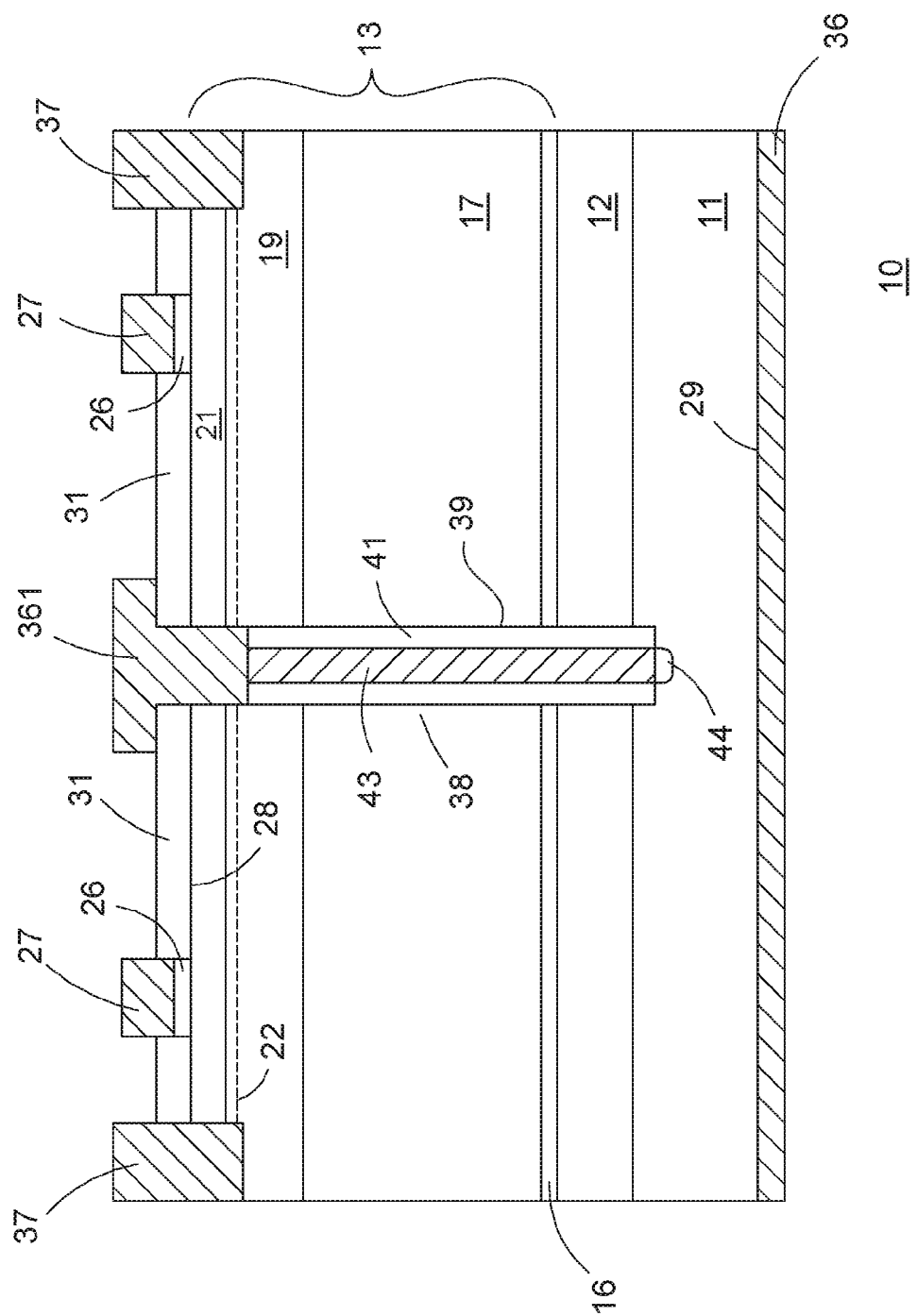
FIG. 1 illustrates an enlarged cross-sectional view of an embodiment of a depletion mode semiconductor device in accordance with the present invention.

For simplicity and clarity of the illustration(s), elements in the figures are not necessarily to scale, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of a MOS transistor or an emitter or a collector of a bipolar transistor or a cathode or anode of a diode, and a control electrode means an element of the device that controls current through the device such as a gate of a MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there can be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description may illustrate a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

In general, the present embodiments relate to a structure and a method of forming the structure for high electron mobility ("HEM") devices. The HEM devices include a base semiconductor substrate and a heterostructure associated with the base substrate. In some embodiments, the heterostructure is a III-nitride series material such as gallium nitride (GaN), aluminum gallium nitride (AlGaN), indium nitride (InN), aluminum nitride (AlN), indium gallium nitride (InGaN), indium aluminum gallium nitride (InAlGaN), or similar materials as known to those of skill in the art. The base semiconductor substrate provides a first current carrying electrode for the HEM device. In some embodiments, a gate structure is provided adjacent a major surface of the heterostructure and a second current carrying electrode is on the major surface but spaced apart from the gate structure.

In some embodiments, the heterostructure includes a GaN channel layer and an AlGaN barrier layer. In some embodiments, at least one internal connector structure extends through the heterostructure to the base semiconductor substrate to provide a low resistance electrical current path from the base substrate to regions of the device proximate to the barrier layer. In some embodiments, the internal connector structure can include first and second conductors. In some embodiments, the internal connector structure includes at least one trench formed in the heterostructure and a portion of the base semiconductor substrate. In some embodiments, the trench is lined with an insulating material and further lined or filled with a conductive material adjacent the insulating material. In other embodiments, the HEM device is integrated with a MOSFET device in a monolithic single-chip configuration.

Attributes of the method and structure described hereinafter provide for the routing of source and gate conductive lines on the top surface of a die with the drain conductive layer on the back surface of the die. In some embodiments, both the source and gate terminals are biased at low voltage, which puts a lower stress on inter-metal dielectric structures. This lower stress reduces electro-migration issues. The structure also provides for semiconductor chip area savings of at least 30% because bonding to the source and gate terminals can be done over the active area of the device. Additionally, the configuration facilitates the assembly of the HEM devices with other devices such as silicon MOSFET devices, which reduces parasitic inductances and resistances compared to related devices.

FIG. 1 illustrates an enlarged cross-sectional view of an embodiment of a semiconductor device 10 configured as a III-nitride depletion mode high electron mobility transistor ("HEMT"). Transistor 10 includes a base substrate, base semiconductor substrate, a region of semiconductor material, semiconductor region, or semiconductor substrate 11. In several embodiments, substrate 11 is a silicon substrate having a (111) orientation and is doped with an n-type dopant such as phosphorous, arsenic or antimony. In other embodiments, substrate 11 can have other orientations. In other embodiments, substrate 11 can be silicon-carbide or other semiconductor materials that can be doped to form a current carrying electrode. In several embodiments, substrate 11 has a low resistivity (that is, has a high dopant concentration) with a resistivity in a typical range from about 0.001 to about 0.01 ohm-cm. In the present embodiment, transistor 10 also includes an optional field extension layer 12, which can be a lower doped n-type silicon epitaxial layer. In other embodiments, field extension layer 12 can be lower doped p-type conductivity. The thickness of field extension layer 12 depends on the required blocking voltage of transistor 10 and a typical thickness is in a range from 2 microns to about 20 microns.

Transistor 10 also includes a heterostructure or epitaxial structure 13, which can be formed on substrate 11 or field extension layer 12 if field extension layer 12 is included. In several embodiments, heterostructure 13 includes a plurality of layers including, for example, a nucleation or buffer layer 16, one or more buffer or transition layers 17, a channel layer 19, and a barrier layer 21. In some embodiments, buffer layer 16 can be, for example, an MN layer situated over field extension layer 12. One or more transition layers 17, which can be optional in some embodiments, can be formed situated over buffer layer 16. In some embodiments, transition layers 17 can be, for example, AlGaN with varying amounts of aluminum concentration. For example, the aluminum concentration can be higher in the transition layers 17 closer to buffer layer 16 and lower closer to channel layer 19.

Channel layer 19 can be formed situated over buffer layer 16 or optional transition layers 17. In several embodiments, channel layer 19 can be, for example, a GaN layer. In some embodiments, barrier layer 21 can be AlGaN and formed over channel layer 19. At the interface of the AlGaN layer 21 and the GaN channel 19 a two-dimensional electron gas (2DEG) layer or region 22 is created, as known to those of ordinary skill in the art.

In some embodiments, transistor 10 further includes a gate dielectric layer or region 26 situated over a portion of barrier layer 21 as illustrated in FIG. 1. In other embodiments, transistor 10 can be configured with a Schottky gate. In some embodiments, gate dielectric region 26 can be silicon nitride, aluminum nitride, aluminum oxide, silicon dioxide or combinations thereof, hafnium oxide, or other materials as known to those of ordinary skill in the art. A control or gate electrode 27 is situated over gate dielectric region 26, and can be, for example, aluminum with a titanium and/or titanium-nitride barrier or other conductive materials as known to those of ordinary skill in the art. As illustrated in FIG. 1, transistor 10 can also include an insulation or insulative layer or layers 31 situated over portions of major surface 28 of heterostructure 13, which can be, for example, silicon nitride, aluminum nitride, combinations thereof, or other insulative materials as known to those of ordinary skill in the art. In some embodiments, insulation layer 31 can be silicon nitride formed using plasma-enhanced chemical vapor deposition techniques ("PECVD"), low pressure chemical vapor deposition ("LPCVD"), metal organic chemical vapor deposition ("MOCVD"), or atomic layer deposition ("ALD"), and can have a thickness in some embodiments from about 0.1 microns to about 0.2 microns. In some embodiments, the silicon nitride forms a field plate that reduces the effect of the high electric fields that can be formed between the drain and gate regions.

In the present embodiment, source electrodes 37 are situated over major surface 28 and contacting barrier layer 21 making ohmic contact to 2DEG region 22. In accordance with the present embodiment, gate electrode 27 can include a Schottky barrier material at the connection with 2DEG region 22. By way of example, titanium-tungsten (with an optional a titanium nitride barrier layer) can used to form the Schottky barrier. In some embodiments, source electrodes 37 can further include aluminum with a barrier layer such as titanium and/or titanium nitride or other conductive materials as known to those of ordinary skill in the art to provide ohmic contacts.

In accordance with the present embodiment, a drain electrode 36 is formed situated adjacent major surface 29 of substrate 11, which is opposite to major surface 28. In some embodiments, drain electrode 36 can be referred to as a drain-down configuration. In several embodiments, drain electrode 36 can be a laminated structure of titanium-nickel-silver, chrome-nickel-gold, or other conductive materials as known to those of ordinary skill in the art.

Also, transistor 10 includes one or more internal conductor structures 38. In several embodiments, internal conductor structures 38 each include a trench 39 formed to extend from major surface 28 generally downward and extending through heterostructure 13, field extension layer 12, and into substrate 11. Trench 39 can be formed using photolithographic techniques and wet or dry etching techniques. In some embodiments, trench 39 is lined or covered with an insulating material or layer 41. Insulating layer 41 can be, for example, silicon oxide, silicon nitride, aluminum oxide, aluminum nitride, or other materials as known to those of ordinary skill in the art. Insulating layer 41 can be formed using PECVD techniques and/or atomic level deposition (ALD) techniques. In one embodiment, insulating layer 41 is aluminum nitride deposited using ALD techniques. In accordance with the present embodiment, insulating layer 41 is configured to help isolate substrate 11, field extension layer 12, and heterostructure 13 from high voltage drain potential when transistor 10 is in operation. Also, insulating layer 41 advantageously prevents or reduces the inversion electrons in the Si—GaN interface from leaking away (for example, to a die edge). This provides the necessary charge to effectively build-up an extra depletion layer in substrate 11, which advantageously increases breakdown voltage.

Insulating layer 41 is locally etched at the bottom surface of trench 39 to form an opening that exposes a portion of substrate 11. Photolithographic and etch techniques are example techniques used for forming the opening adjoining the bottom surface of trench 39. In some embodiments, insulating layer 41 is further recessed or removed from upper surfaces of trench 39 to a location proximate to or slightly below 2DEG region 22 as illustrated in FIG. 1. In other embodiments, an optional enhancement region 44 can be formed situated adjoining a lower surface of trench contact 43 in substrate 11. By way of example, enhancement region 44 can be a doped region or can be a silicide region.

In some embodiments, a conductive material is formed within trench 39 adjoining insulating layer 41 and contacting substrate 11 through the opening in the bottom of trench 39 to form a conductive trench contact or second conductor 43. In some embodiments, trench contact 43 can be, for example, doped polycrystalline semiconductor material, doped polysilicon, aluminum, copper, tungsten, or other similar materials as known to those of ordinary skill in the art. In some embodiments, the conductive layer is deposited over the structure and within trench 39, and then planarized and recessed within trench 39 to form trench contact 43 as illustrated in FIG. 1. Another conductive material can then be deposited over major surface 28 and patterned to leave a first conductor or ohmic contact 361 adjacent to major surface 28 and contacting 2DEG region 22 and trench contact 43. In some embodiments, first conductor 361 can be aluminum with a barrier layer such as titanium and/or titanium nitride or other conductive materials as known to those of ordinary skill in the art.

In accordance with the present embodiment, a main current carrying electrode or terminal is advantageously placed at the backside (that is, the major surface opposite to the surface where another main current carrying electrode is placed) of substrate 11 where it is contacted by electrode 36. More particularly, the transistor of the present embodiment has a lateral current conductive component between source contact 37 and first conductor 361 through 2DEG region 22. In the present structure, gate pinch-off can have a lateral orientation. The current is then picked up by trench electrode 43 as a vertical current conductive component to substrate 11 and drain electrode 36. In some embodiments, it is contemplated that trench contact 43 is placed under each first conductor 361 within transistor 10, and directly brought down to substrate 11 and in electrical communication with drain electrode 36 thereby eliminating the need for lateral metal routing over major surface 28. This approach reduces electro-migration issues associated with power metal routing lines or traces.

As will be explained in more detail later, the present embodiment is advantageously configured to accommodate the integration of a silicon MOSFET in, for example, a stacked die configuration, which reduces parasitic inductances and resistances and further facilitates a simplified assembly process. A further advantage of the present embodiment is that with drain electrode 36 on the backside of substrate 11, there is no high voltage metal routing on the front side of transistor 10, which facilitates the placement of the source electrode pad overlying the active region of transistor 10. This provides a chip area savings of at least 30%.

Figure 2:
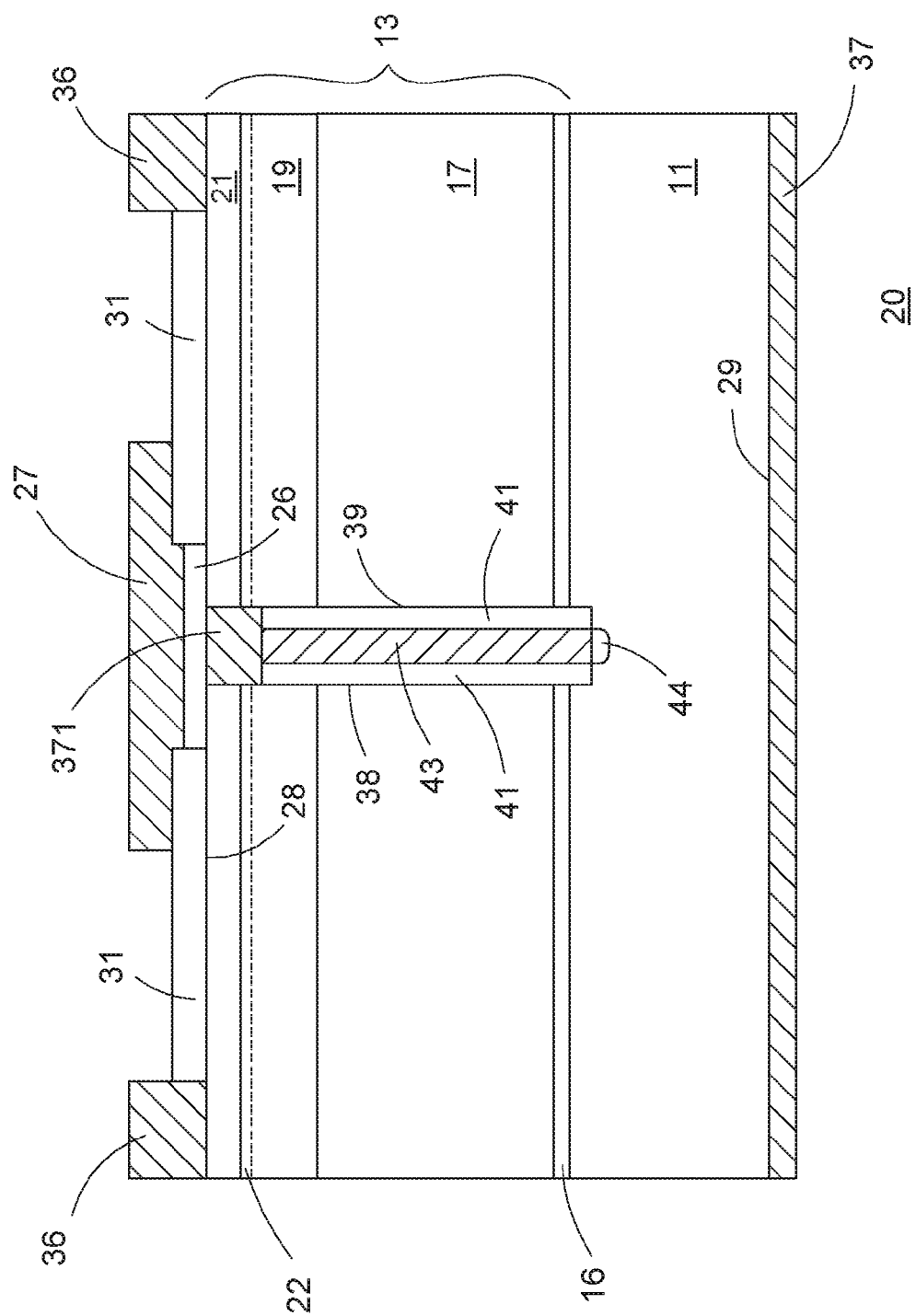
FIG. 2 illustrates an enlarged cross-sectional view of an embodiment of an enhancement mode semiconductor device in accordance with another embodiment of the present invention.

Referring now to FIG. 2, there is illustrated a semiconductor device 20 in accordance with another embodiment. Transistor 20 can be referred to as a HEMT device because of the high mobility of electrons in channel layer 19. In some embodiments, transistor 20 is configured as an enhancement mode device. Transistor 20 is similar in structure to the previously described transistor 10, with only the distinctions between the transistors 10, 20 described hereinafter.

One distinction between transistors 10, 20 is the placement of source electrode 37 on major surface 29 and the placement of drain electrodes 36 on major surface 28 to provide what is referred to as a source down configuration. In some embodiments, drain electrodes 36 provide ohmic contacts to barrier layer 21. In other embodiments, drain electrodes 36 provide ohmic contacts to 2DEG region 22. Another distinction between transistors 10, 20 is the configuration of the gate structure, which is formed in transistor 20 on barrier layer 21 between drain electrodes 36. In the present embodiment, gate layer 26 can be hafnium dioxide or aluminum oxide or other materials as known to those of ordinary skill in the art. In the present embodiment, the gate structure depletes some of the charge in the gate channel and assists in forming the enhancement mode characteristics of transistor 20. A further distinction between transistors 10, 20 is that internal vertical connector structure 38 is formed through channel layer 19 to form a low resistance electrical connection between the source region of substrate 11 and barrier layer 21. The internal connector structure 38 includes a first conductor 371 formed in contact with barrier layer 21. First conductor 371 forms an electrical connection to the material of barrier layer 21. Typically, at least a portion of first conductor 371 abuts a portion of barrier layer 21. In some embodiments, first conductor 371 is recessed within barrier layer 21. In other embodiments, first conductor 371 can extend through barrier layer 21 to major surface 28 as illustrated in FIG. 2. In another embodiment, first conductor 371 forms a Schottky contact. The Schottky contact can also assist in the enhancement mode characteristics of some embodiments. In another embodiment, first conductor 371 can underlie gate layer 26, but can be in other positions in other embodiments. First conductor 371 can be formed from polysilicon, doped polysilicon, tungsten, aluminum, or other conductor materials as known to those of skill in the art.

Isolation layer 31 is formed to be situated on a portion of barrier layer 21 between drain electrodes 36 and the gate structure and can extend partially under a portion of gate electrode 27. In some embodiments, insulator layer 31 forms a field plate that reduces the effect of high electric fields that can be formed between the drain and gate structure when transistor 20 is in operation. Similar to transistor 10, transistor 20 includes low resistance trench contact 43, which improves the operation of transistor 20.

Figure 3:
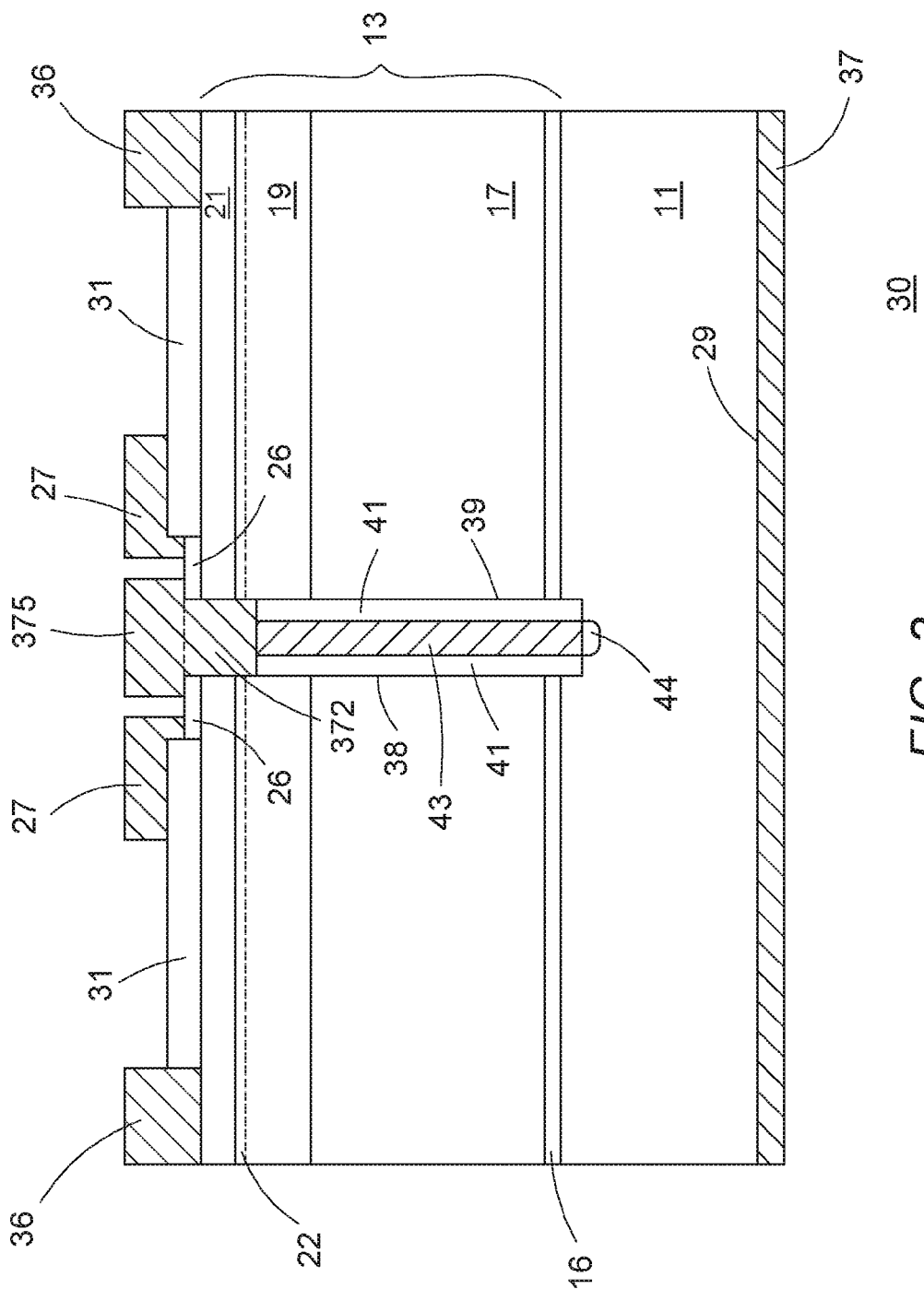
FIG. 3 illustrates an enlarged cross-sectional view of a depletion mode semiconductor device that is an alternate embodiment of the semiconductor device of FIG. 2.

FIG. 3 illustrates an enlarged cross-sectional view of a depletion mode semiconductor device 30 that is an alternate embodiment of transistor 20. Transistor 30 can be sometimes referred to as a HEMT device because of the high mobility of electrons in channel layer 19. Transistor 30 is similar in structure to the previously described transistor 20, with only the distinctions between the transistors 20, 30 described hereinafter. One distinction between transistors 20, 30 is the first conductor of internal conductor structure 38 can be extended through gate layer 26 and form an overhang 375 on dielectric layer 26. Gate electrode 27 is spaced apart from overhang 375 by at least 0.1 μm. In another embodiment, overhang 375 can be made out of the same metal layer as gate electrode 27.

Figure 4:
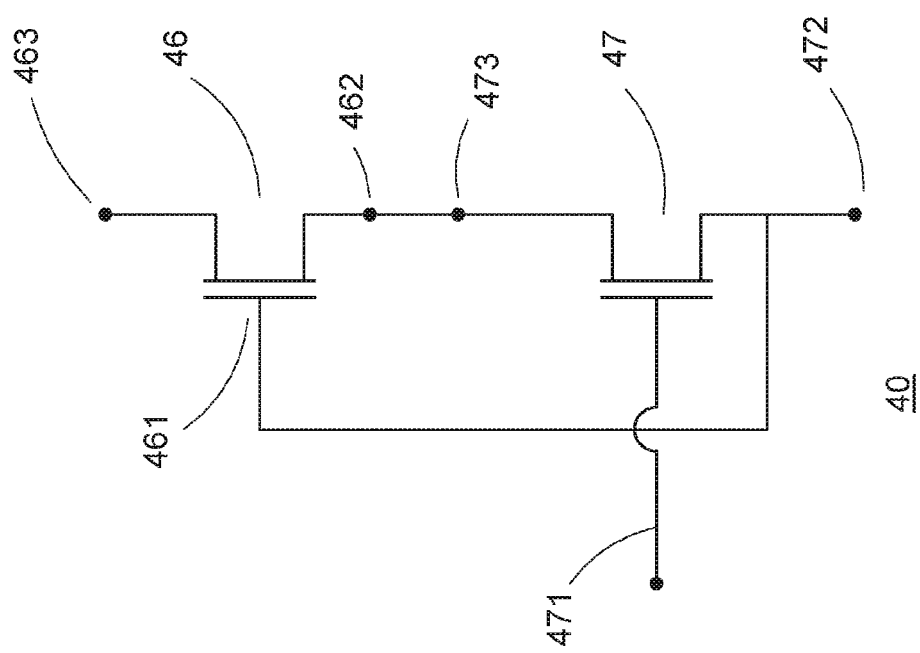
FIG. 4 schematically illustrates a cascode circuit configuration in accordance with the present invention.

FIG. 4 schematically illustrates a cascode circuit configuration 40 of a depletion mode HEMT device 46 and a metal oxide semiconductor field effect transistor (MOSFET) 47 in accordance with one embodiment. HEMT device 46 includes a gate electrode 461, a source electrode 462, and a drain electrode 463. MOSFET 47 includes a gate electrode 471, a source electrode 472 electrically connected to gate electrode 461 of HEMT device 46, and a drain electrode 473 electrically connected to source electrode 462 of HEMT device 46. In some embodiments, depletion mode HEMT device 46 can be a 60 mΩ 600V HEMT and MOSFET 47 can be a 20 mΩ 20V silicon MOSFET. In some embodiments of configuration 40, the threshold voltage ($V_{th}$) is determined by $V_{th}$ of MOSFET 47. For the gate ON condition, gate electrode 461 and source electrode 462 of HEMT device 46 are at zero volts. Because of the depletion mode characteristics, the depletion mode transistor is ON. For the gate OFF condition, gate electrode 461 of HEMT device 46 is about 10-20V below source (determined by leakage current in HEMT device 46). Because of the depletion mode characteristics, the depletion mode transistor is OFF. At least some of the embodiments of the HEM transistors presented herein provide an improved structure for achieving a simplified cascode stacking of a silicon MOSFET with a III-nitride depletion mode HEMT device. One attribute of this structure is that it provides enhancement mode emulation with reduced parasitic inductance between the drain of the silicon MOSFET and the source of the HEMT. Among other things, this reduces ringing effects.

Figure 5C:
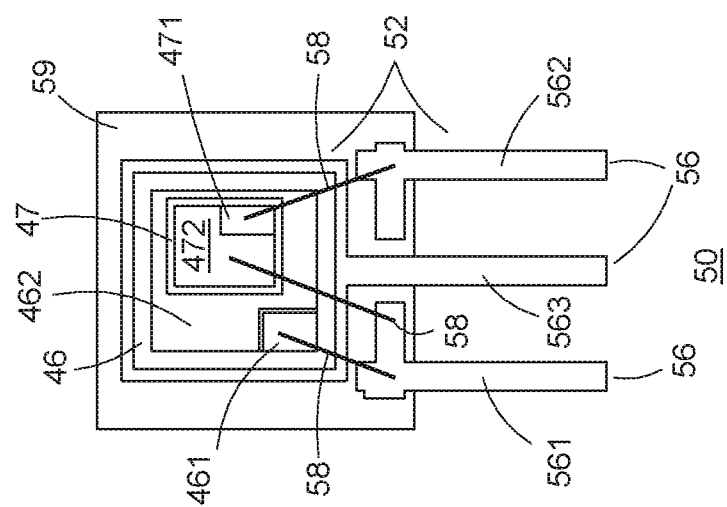
FIGS. 5B and 5C illustrate top views of a packaged semiconductor device including the embodiment of FIG. 5A at various stages of fabrication.
Figure 5B:
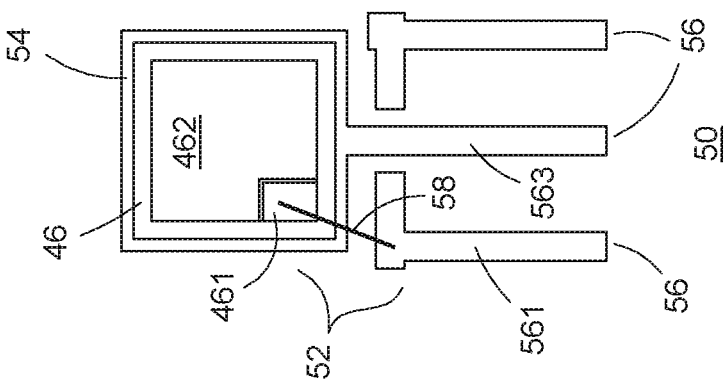
Figure 5A:
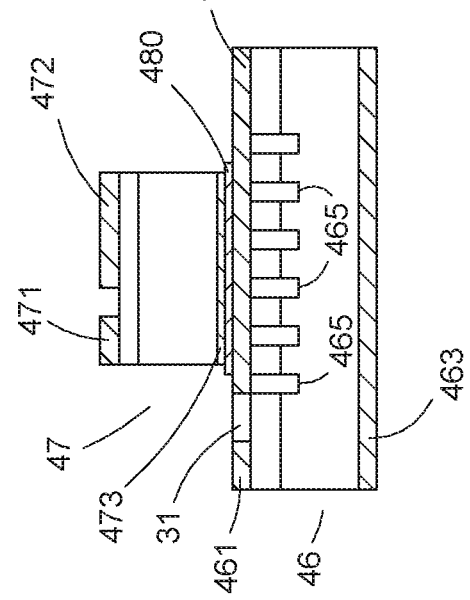
FIG. 5A illustrates an enlarged cross-sectional view of a HEMT device and a MOSFET device in a cascode configuration in accordance with an embodiment of the present invention.

FIGS. 5A-C and 6A-C are simplified cross-sectional views of stacked MOSFET and HEMT devices and top views of the stacked devices on example lead frame structures to illustrate embodiments of cascode configuration 40. FIG. 5A illustrates a MOSFET 47 stacked onto a depletion mode HEMT device 46 in accordance with a first embodiment. In this embodiment, HEMT device 46 is a drain down configuration and can be, for example, similar to transistor 10. HEMT device 46 includes drain electrode 463, which is in electrical communication with vertical internal conductor structures 465 described previously. On the opposite surface, source electrode 462 is separated from gate electrode 461 by insulative layer 31 described previously. In some embodiments, MOSFET 47 is attached to source electrode 462 using a conductive attach structure 480, which can be, for example, a conductive solder or epoxy or other materials. In this configuration, drain electrode 473 of MOSFET 47 is attached to source electrode 462 of HEMT device 46. It is understood that some of the details of HEMT device 46 discussed previously in conjunction with transistor 10 may not be shown in FIG. 5A to simply the illustration.

FIG. 5B is a top view of a packaged semiconductor device 50 at an intermediate stage of fabrication. In some embodiments, device 50 has a lead frame 52 that includes a die pad 54 and a plurality of leads 56. It is understood that device 50 can use other types of package substrates. At this stage of fabrication, drain electrode 463 of HEMT device 46 is attached with a conductive material (not shown) to die pad 54. Gate electrode 461 is electrically connected to one of the leads 56 configured as a gate lead 561. In some embodiments, gate electrode 461 is connected to gate lead 561 with a conductive wire 58. One of leads 56 is configured as a drain lead 563 and in some embodiments is directly connected to die pad 54 as illustrated in FIG. 5B. Element 462 is the source electrode, which is sized and configured to facilitate the placement of MOSFET 47 in contact with it.

FIG. 5C is a top view of packaged semiconductor device 50 after additional processing that includes attaching MOSFET 47 to source electrode 462 of HEMT device 46 with conductive attach structure 480 (illustrated in FIG. 5A). Source electrode 472 of MOSFET 47 is electrically connected to gate lead 561 with, for example, another conductive wire 58. Gate electrode 471 of MOSFET 47 is electrically connected to another lead 56 configured as another gate lead 562 with, for example, a further conductive wire 58. Packaged semiconductor device 50 can then be encapsulated with a molded resin material 59 to protect the structure. Packaged semiconductor device 50 is an embodiment of a cascode transistor configuration 40 illustrated in FIG. 4 that is facilitated by HEMT device 46 having a drain down configuration in accordance with at least one of the present embodiments.

Figure 6C:
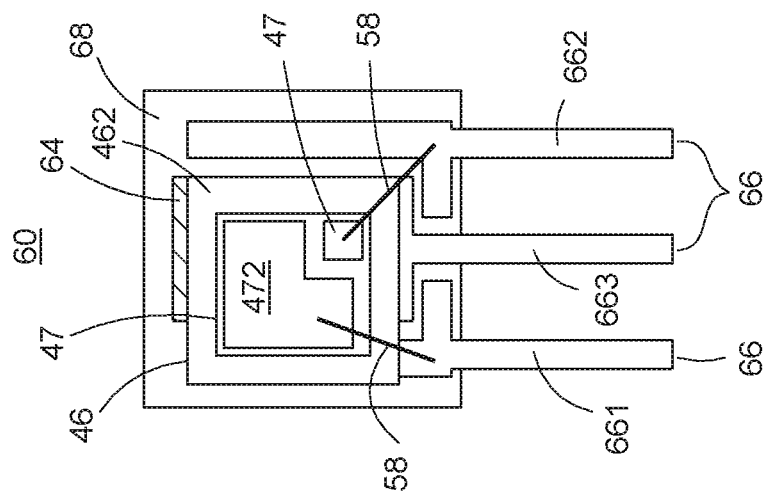
FIGS. 6B and 6C illustrate top views of a packaged semiconductor device including the embodiment of FIG. 6A at various stages of fabrication.
Figure 6B:
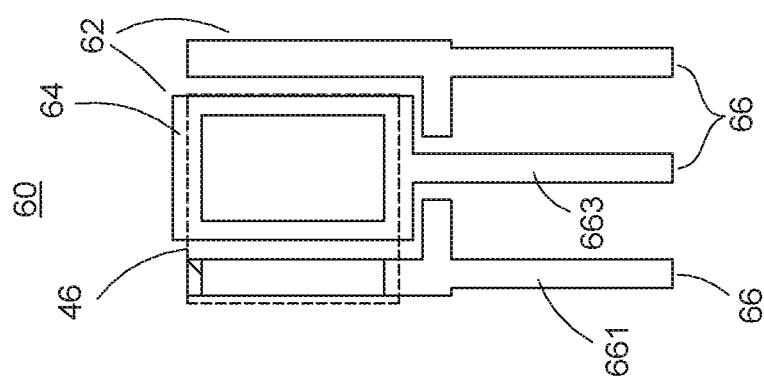
Figure 6A:
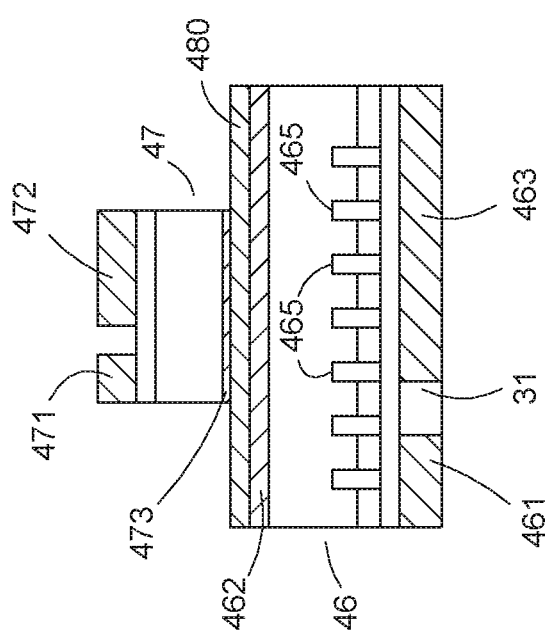
FIG. 6A illustrates an enlarged cross-section view of a of HEMT device and a MOSFET device in a cascode configuration in accordance with another embodiment of the present invention.

FIG. 6A illustrates a MOSFET 47 stacked onto a depletion mode HEMT device 46 in accordance with another embodiment. In this embodiment, HEMT device 46 is a source down configuration and can be, for example, similar to transistor 30. HEMT device 46 includes source electrode 462, which is in electrical communication with vertical internal conductor structures 465 described previously. On the opposite surface, drain electrode 463 is separated from gate electrode 461 by insulative layer 31 described previously. In some embodiments, MOSFET 47 is attached to source electrode 462 using a conductive attach structure 480, which can be, for example, a conductive solder or epoxy or other materials. In this configuration, drain electrode 473 of MOSFET 47 is attached to source electrode 462 of HEMT device 46. It is understood that some of the details of HEMT device 46 discussed previously in conjunction with transistor 30 may not be shown in FIG. 6A to simply the illustration.

FIG. 6B is a top view of a packaged semiconductor device 60 at an intermediate stage of fabrication. In some embodiments, device 60 has a lead frame 62 with a die pad 64 and plurality of leads 66. It is understood that device 60 can use other types of package substrates. At this stage of fabrication, drain electrode 463 of HEMT device 46 is attached with a conductive material (not shown) to die pad 64 and gate electrode 461 is attached with a conductive material to one leads 66 configured as a gate lead 661. In some embodiments, HEMT device 46 can be attached with a conductive solder, a conductive epoxy or similar material. The outline of HEMT device 46 is shown as a dashed line to illustrate the direct attachment of gate electrode 461 and drain electrode directly lead frame 62. One of leads 66 is configured as a drain lead 663 and in some embodiments is directly connected to die pad 64 as illustrated in FIG. 6B.

FIG. 6C is a top view of packaged semiconductor device 60 after additional processing that includes attaching MOSFET 47 to source electrode 462 of HEMT device 46 with conductive attach structure 480 (not shown). Source electrode 472 of MOSFET 47 is electrically connected to gate lead 661 with, for example, another conductive wire 58. Gate electrode 471 of MOSFET 47 is electrically connected to another lead 66 configured as another gate lead 662 with, for example, a further conductive wire 58. Packaged semiconductor device 60 can then be encapsulated with a molded resin material 68 to protect the structure. Packaged semiconductor device 60 is an embodiment of a cascode transistor configuration 40 illustrated in FIG. 4 that is facilitated by HEMT device 46 having a source down configuration in accordance with the present embodiments.

Figure 7:
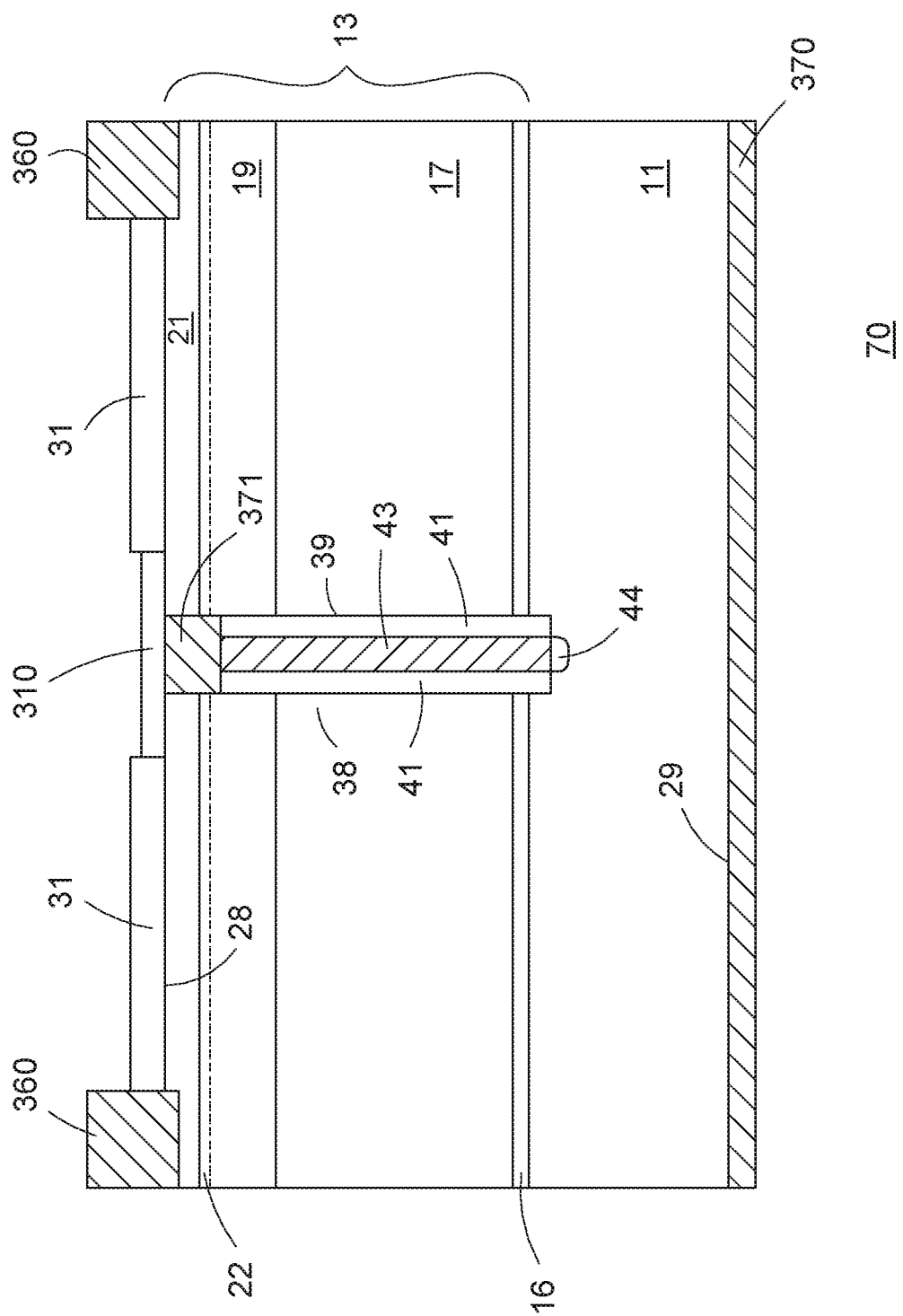
FIG. 7 illustrates an enlarged cross-sectional view of an embodiment of a Schottky diode structure in accordance with the present invention.

FIG. 7 illustrates an enlarged cross-sectional view of an embodiment of a Schottky diode 70. Diode 70 is similar in structure to transistor 20 (FIG. 2), with only the distinctions between the transistor 20 and diode 70 described hereinafter. One distinction between transistor 20 and diode 70 is gate layer 26 and gate electrode 27 are omitted. In addition, another insulative layer 310 overlies first conductor 371 of the internal conductor structure. Insulative layer 310 can be a similar material to insulative layer 31. In some embodiments, insulative layer 310 can be silicon nitride. In some embodiments, electrodes 360 are configured as anode electrodes for diode 70 and electrode 370 is configured as a cathode electrode for diode 70. Electrodes 360 and 370 can be similar materials as described previously for electrodes 36 and 37. Electrode 360 makes a Schottky contact to 2DEG region 22, whereas electrode 371 makes an ohmic contact to 2DEG region 22. In accordance with the present embodiment, internal conductor structure 38 provides a vertical conduction path between the anodes and cathode of diode 70. This configuration is referred to as "cathode-down". In yet another embodiment, referred to as "anode-down", electrode 360 makes an ohmic contact to 2DEG region 22, whereas electrode 371 makes a Schottky contact to 2DEG region 22. Internal conductor structure 38 provides a vertical conduction path between the anode and cathodes of diode 70.

Figure 8:
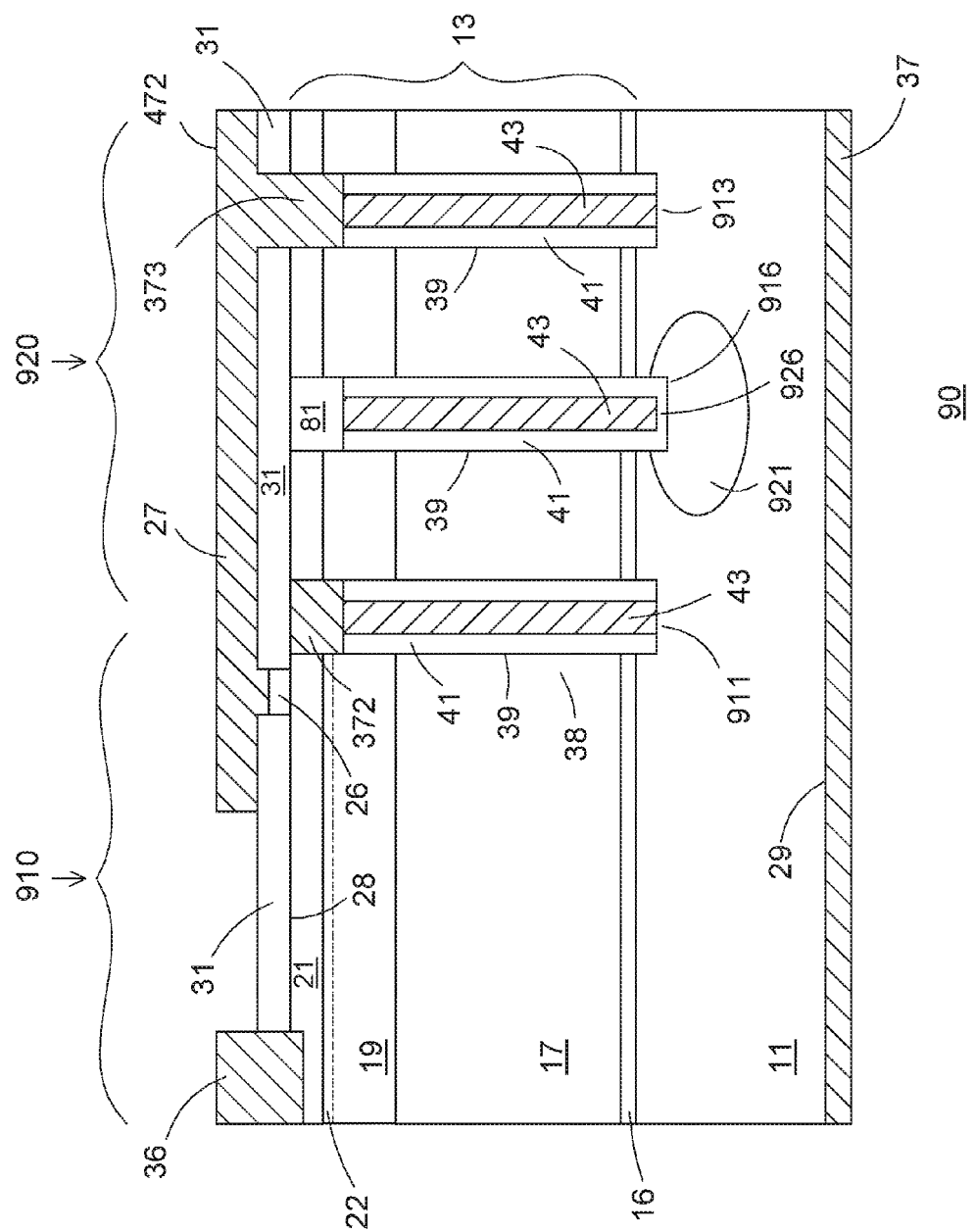
FIG. 8 illustrates an enlarged cross-sectional view of an embodiment of a multi-transistor device that includes a depletion mode HEMT and a silicon MOSFET formed monolithically on one semiconductor substrate in accordance with the present invention.

FIG. 8 illustrates an enlarged cross-sectional view of an embodiment of a multi-transistor device 90 that includes a depletion mode HEMT device 910 and a silicon MOSFET 920 formed together in a cascode circuit configuration monolithically on one semiconductor substrate resulting in a monolithically integrated semiconductor device. In some embodiments, the one semiconductor substrate includes substrate 11 having heterostructure 13 or substrate 11 with layer 12 and having heterostructure 13 as described previously.

Device 90 includes a depletion mode HEMT transistor 910 that can be configured similarly to transistor 30. In another embodiment, substrate 11 of device 90 can have a different doping concentration, for example a lower dopant concentration, than that of substrate 11 of transistor 30. Substrate 11 forms the source of HEMT device 910 and a drain of HEMT device 910 is formed on surface 28 of device 90 similarly to transistor 30. Gate layer 26 underlies at least one portion of gate electrode or conductor 27 of HEMT device 910. The drain of the HEMT is contact 36. In region 920 of device 90, the 2DEG region 22 is destroyed, for example, by ion implantation with nitrogen, argon, iron, or similar methods as known to those of ordinary skill in the art. In region 910 (HEMT device) of device 90, the 2DEG region 22 is maintained.

A first internal conductor structure 911 forms a low resistance connection to and between 2DEG region 22 (and hence the drain region of MOSFET device 920) and substrate 11. In some embodiments, first internal conductor structure 911 is similar to internal conductor structure 38 and includes a trench 39 extending from major surface 28 into substrate 11. Similar to transistor 30, trench 39 is lined with insulating layer 41 and further includes a conductive trench contact 43 configured to provide an ohmic contact to substrate 11. In some embodiments, first internal conductor structure 911 is electrically connected to 2DEG region 22 through first conductor 372, which forms an electrical connection to trench contact 43. Conductor 372 is isolated from gate electrode 27 through insulating layer 31.

A second internal conductor structure 913 forms a low resistance connection to and between gate electrode 27 and substrate 11. In some embodiments, second internal conductor structure 913 includes a trench 39 extending from major surface 28 into substrate 11. Similar to transistor 30, trench 39 is lined with insulating layer 41 and further includes a conductive trench contact 43 configured to provide an ohmic contact to substrate 11. In some embodiments, second internal conductor structure 913 is electrically connected to a source electrode 472 with a second conductor 373, which extends through the underlying insulative layer 31 and forms an electrical connection to trench contact 43. In this configuration, second internal conductor structure 913 forms a source region with a portion of substrate 11 for MOSFET 920. Further in this configuration, first internal conductor structure 911 forms a drain of MOSFET 920 with another portion of substrate 11. Additionally, first internal conductor structure 911 is configured to function as at least a portion of the source of HEMT device 910. Thus, in accordance with the present embodiment, the source of HEMT device 910 and the drain of MOSFET 920 are connected together as illustrated in FIG. 4. Second internal conductor structure 913 forms an electrical connection between the source of MOSFET 920 and a source conductor electrode 472 formed on the surface of device 90. In some embodiments, source electrode conductor 472 also connects to gate electrode 27 of HEMT device 910. This forms an electrical connection between the HEMT gate and the MOSFET source as illustrated in FIG. 4.

A doped region 921 is formed in substrate 11 in a region between the source and drain of MOSFET 920 to form a channel region of MOSFET 920. Doped region 921 has a doping type that has opposite conductivity to that of substrate 11. In some embodiments, doped region 921 is p-type and has a dopant concentration configured to form a channel under a selected gate bias. An internal gate structure 916 of MOSFET 920 is formed adjoining doped region 921. In some embodiments, internal gate structure 916 has a similar structure to first and second internal conductor structures 911 and 913. In some embodiments, internal gate structure 916 includes a trench 39 lined with insulating layer 41 and having a trench conductor 43. One difference is that internal gate structure 916 includes gate dielectric layer 926 separating trench conductor 43 from doped region 921. In some embodiments, gate dielectric layer 926 is silicon oxide or other gate materials used in MOSFET devices. In some embodiments, gate dielectric layer 926 is thinner than insulating layer 41. In one embodiment, a portion 81 of insulating layer 31 on major surface 28 on the surface near the HEMT gate is extended to cover another end of the trench conductor 43 in internal gate structure 916. In some embodiments, electrical contact is made to trench conductor 43 in internal gate structure 916 in another portion of device 90 (not shown).

Figure 9:
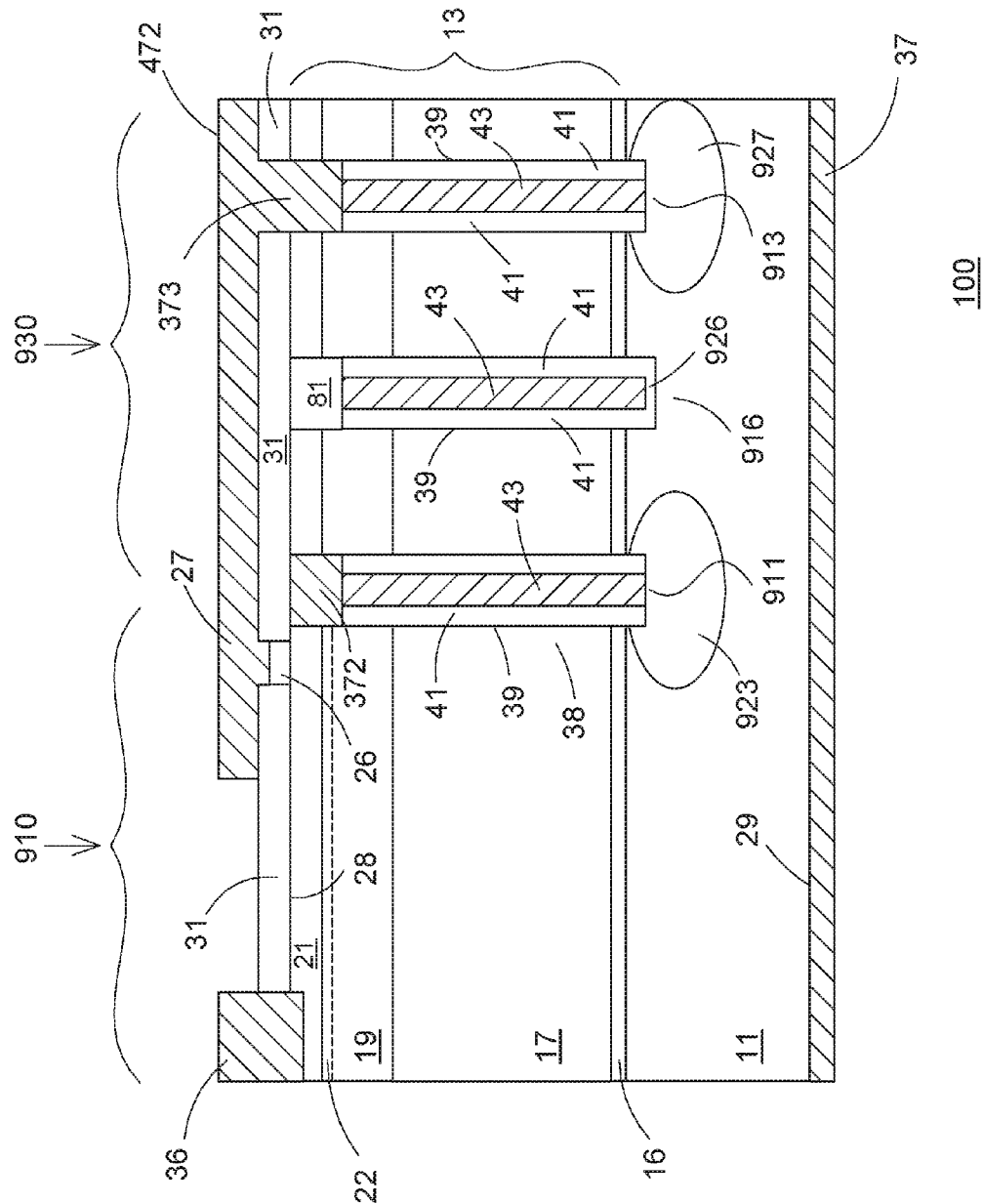
FIG. 9 illustrates an enlarged cross-sectional view of another embodiment of a multi-transistor device in accordance with another embodiment of the present invention.

FIG. 9 illustrates an enlarged cross-sectional view of an embodiment of a multi-transistor device 100 that is an alternate embodiment of device 90 illustrated in FIG. 8. Device 100 is similar to device 90 but has a different conductivity type of MOSFET 930. In some embodiments, substrate 11 in device 100 includes a p-type substrate instead of the N-type substrate of device 90. In some embodiments, a portion of substrate 11 below internal gate structure 916 functions as the channel region of the MOSFET. Device 100 also includes a first doped region 927 of an opposite conductivity type (opposite to the substrate type, for example, n-type) formed in the substrate to function as the source region of MOSFET 930. Another doped region 923 of the opposite conductivity type to substrate 11 is formed to function as the drain of MOSFET 930 and the source of HEMT device 910. The gate of the MOSFET is formed as a gate structure similar to the gate structure of device 90 except that the gate structure adjoins a channel region of the substrate instead of a channel region formed by a doped region formed in the substrate. In some embodiments, first conductor 372 is isolated from gate electrode 27 by insulative layer 31 in first internal conductor structure 911.

From all of the foregoing, those skilled in the art can determine that according to one embodiment, a method of forming a semiconductor device can comprise providing a base substrate of a first semiconductor material (for example, element 11) wherein the base substrate defines a first current carrying electrode of the semiconductor device; forming III-nitride channel layer (for example, element 19) on the base substrate; forming a III-nitride barrier layer (for example, element 21) on the channel layer; forming a second current carrying electrode of the semiconductor device in the barrier layer; forming a gate (for example, element 27) of the semiconductor device overlying a portion of the barrier layer and spaced apart from the second current carrying electrode; and forming a first internal conductor structure (for example, element 38) extending from the barrier layer through the channel layer to the base substrate wherein the internal connector structure forms a low resistance vertical electrical current path from the base substrate to the barrier layer.

In another embodiment, the method can include forming the internal conductor structure to electrically connect to the base substrate and to the barrier layer.

A further embodiment of the method can include forming a first conductor within the barrier layer and forming a second conductor extending from the first conductor to the base substrate and forming an insulator between the second conductor and the channel layer.

In another embodiment, the method can include forming a Schottky barrier connection between the first conductor and the barrier layer.

In another embodiment, the method can include forming the internal conductor structure to electrically connect to the base substrate and to a major surface of the barrier layer.

In a further embodiment, the method can include forming a first doped region of a first conductivity type in the base substrate and spaced apart from the first internal conductor structure wherein the first conductivity type is opposite to a conductivity type of the base substrate; forming a gate conductor of a MOS transistor overlying the first doped region wherein a portion of the first doped region forms a channel region of the MOS transistor; forming a second internal conductor structure adjacent to but spaced apart from the first doped region, the second internal conductor structure extending from the barrier layer through the channel layer to the base substrate wherein the internal connector structure forms a low resistance electrical current path.

Another embodiment of the method can include forming a first current carrying electrode of the MOS transistor as a portion of the base substrate underlying the first internal conductor structure.

In another embodiment, the method can also forming an electrical path between the gate and the second internal conductor structure to form a low resistance electrical connection from the gate to the base substrate wherein a portion of the base substrate underlying the second internal conductor structure forms a first current carrying electrode of the MOS transistor.

Another embodiment of the method can include forming a first doped region of a first conductivity type in the base substrate and abutting the first internal conductor structure wherein the first conductivity type is opposite to a conductivity type of the base substrate and wherein the first doped region forms a first current carrying electrode of an MOS transistor; forming a second doped region of the first conductivity type in the base substrate and spaced apart from the first doped region wherein the second doped region forms a second current carrying electrode of the MOS transistor; forming a gate conductor of the MOS transistor overlying a portion of the base substrate that is between the first and second doped regions wherein the portion of the base substrate forms a channel region of an MOS transistor; forming a second internal conductor structure extending from the barrier layer through the channel layer to the second doped region wherein the internal connector structure forms a low resistance electrical current path.

In another embodiment, the method can also include forming an electrical path between the gate and the second internal conductor structure to form a low resistance electrical connection from the gate to the second current carrying electrode of the MOS transistor.

Those skilled in the art will also appreciate that another embodiment of a semiconductor device can comprise a semiconductor substrate (for example, element 11) of a first conductivity type, wherein the semiconductor substrate provides a first current carrying electrode of the semiconductor device; a plurality of III-nitride layers (for example, elements 16, 17, 19, 21) on the semiconductor substrate to provide an HEM structure; and an internal conductor structure (for example, element 38) extending from a major surface (for example, element 28) of the HEM structure to the semiconductor substrate providing a vertical current path from the semiconductor substrate to the HEM structure.

Another embodiment can include an epitaxial layer between the conductive substrate and the plurality of III-nitride layers, wherein the epitaxial layer is of the first conductivity type and has a lower dopant concentration than the semiconductor substrate.

In another embodiment, the internal conductor structure includes a dielectric liner along a trench sidewall, which has an opening at the bottom of the trench; a trench filling, using a highly conductive layer, making contact to the conductive substrate and to a 2DEG region of the HEM device; and a first current carrying contact adjoining a back surface of the semiconductor substrate and in electrical communication with the trench filling.

In a further embodiment, the plurality of III-nitride layers includes a GaN channel layer and an AlGaN barrier layer on the GaN channel layer to provide the 2DEG region. In other embodiments, the semiconductor device can further include a second current carrying contact in the AlGaN barrier layer; and a gate structure overlying a portion of the AlGaN barrier layer and spaced apart from the second current carrying electrode, and wherein the internal connector structure forms a low resistance electrical current path from the semiconductor substrate to the AlGaN barrier layer.

Those skilled in the art will further appreciate that another embodiment of a semiconductor device can have a base substrate (for example, element 11) of a first semiconductor material wherein the base substrate forms a first current carrying electrode of the semiconductor device; a heterostructure (for example, element 13) comprising a III-nitride channel layer (for example, element 19) over the base substrate and a III-nitride barrier layer (for example, element 21) over the channel layer; a second current carrying electrode of the semiconductor device in the barrier layer (for example, element 36, 37); a gate (for example, element 27) of the semiconductor device overlying a portion of the barrier layer and spaced apart from the second current carrying electrode; and a first internal conductor structure (for example, element 38) extending from the barrier layer through the channel to the base substrate wherein the internal connector structure forms a low resistance electrical current path from the base substrate to the barrier layer.

In one embodiment, the first internal conductor structure electrically connects to the base substrate and to the barrier layer. In another embodiment, the first internal conductor structure is within the barrier layer and further comprises a second conductor extending from the first conductor to the base substrate, and wherein the second conductor is insulated from the channel layer. In other embodiments, the heterostructure comprises an AlGaN buffer layer on the base substrate; a GaN channel layer on the AlGaN buffer region; and an AlGaN barrier layer on the GaN channel layer.

In a further embodiment, the semiconductor device further comprises a first doped region of a first conductivity type in the base substrate and spaced apart from the first internal conductor structure wherein the first conductivity type is opposite to a conductivity type of the base substrate; a gate conductor of an MOS transistor overlying the first doped region wherein a portion of the first doped region forms a channel region of the MOS transistor; and a second internal conductor structure adjacent to but spaced apart from the first doped region, the second internal conductor structure extending from the barrier layer through the channel layer to the base substrate, wherein the internal connector structure forms a low resistance electrical current path.

In an alternative embodiment, the semiconductor device further comprises a first doped region of a first conductivity type in the base substrate and abutting the first internal conductor structure wherein the first conductivity type is opposite to a conductivity type of the base substrate and wherein the first doped region forms a first current carrying electrode of an MOS transistor;
a second doped region of the first conductivity type in the base substrate and spaced apart from the first doped region wherein the second doped region forms a second current carrying electrode of the MOS transistor; a gate conductor of the MOS transistor overlying a portion of the base substrate that is between the first and second doped regions wherein the portion of the base substrate forms a channel region of an MOS transistor; and a second internal conductor structure extending from the barrier layer through the channel layer to the second doped region wherein the internal connector structure forms a low resistance electrical current path.

In other embodiments, an enhancement region is included in the base substrate adjoining the second internal conductor. In one embodiment, the enhancement region is a doped region. In another embodiment, the enhancement region is a silicide region.

In summary, a method for forming an HEM device and a structure therefore has been described. A highly doped base semiconductor substrate provides one current carrying electrode for the HEM device. A heterostructure is provided on the base semiconductor substrate and includes a III-nitride channel layer and a III-nitride barrier layer on the channel layer. A second current carrying electrode is situated in proximity to the barrier layer and, in some embodiments, a gate structure is provided in spaced relationship with the barrier layer. The structure includes at least one internal conductor structure that provides a vertical current path between the second current carrying electrode and the base substrate. Among other things, the method and structure provide for the routing source and gate conductive lines on the top surface of the structure with the drain conductive layer on the back surface of the die. In some embodiments, both the source and gate terminals are biased at low voltage, which puts a lower stress on inter-metal dielectric structures. This lower stress reduces electro-migration issues. The structure also provides for semiconductor chip area savings of at least 30% because bonding to the source and gate terminals can be done over the active area of the device. Additionally, the configuration facilitates the assembly of the HEM devices with other devices such as silicon MOSFET devices, which reduces parasitic inductances and resistances.

While the subject matter of the descriptions are described with specific preferred embodiments and example embodiments, the foregoing drawings and descriptions thereof depict only typical and exemplary embodiments of the subject matter and are not therefore to be considered to be limiting of its scope, it is evident that many alternatives and variations will be apparent to those skilled in the art.

As the claims hereinafter reflect, inventive aspects can lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

We claim:

1. A semiconductor device comprising:
a semiconductor substrate of a first conductivity type, wherein the semiconductor substrate provides a first current carrying electrode of the semiconductor device;

a plurality of III-nitride layers on the semiconductor substrate to provide an HEM structure; and
an internal conductor structure extending from proximate to a major surface of the HEM structure to the semiconductor substrate providing a vertical current path from the semiconductor substrate to the HEM structure, wherein the internal conductor structure comprises:
a trench;
a dielectric liner along a trench sidewall, the dielectric liner having an opening proximate to a bottom surface of the trench;
a trench filling comprising a conductive layer, wherein the trench filling makes contact to the semiconductor substrate and to a 2DEG region of the HEM device; and
a first current carrying contact adjoining a back surface of the semiconductor substrate and in electrical communication with the trench filling.

2. The semiconductor device of claim 1 further comprising an epitaxial layer between the semiconductor substrate and the plurality of III-nitride layers, wherein the epitaxial layer is of the first conductivity type and has a lower dopant concentration than the semiconductor substrate.

3. The semiconductor device of claim 1, wherein the plurality of III-nitride layers includes a GaN channel layer and an AlGaN barrier layer on the GaN channel layer to provide the 2DEG region, and wherein the semiconductor device further comprises:
a second current carrying electrode in the AlGaN barrier layer; and
a gate structure overlying a portion of the AlGaN barrier layer and spaced apart from the second current carrying electrode, and wherein the internal connector structure forms a low resistance electrical current path from the semiconductor substrate to the AlGaN barrier layer.

4. A cascode semiconductor structure comprising:
a depletion mode HEMT device comprising:
  a base substrate of a first semiconductor material, wherein the base substrate forms a first current carrying electrode;
  a heterostructure comprising a III-nitride channel layer over the base substrate and a III-nitride barrier layer over the channel layer;
  a second current carrying electrode coupled to the barrier layer;
  a first gate electrode overlying a portion of the barrier layer and spaced apart from the second current carrying electrode; and
  a first internal conductor structure extending from the barrier layer through the channel layer to the base substrate, wherein the first internal conductor structure forms a low resistance electrical current path from the base substrate to the barrier layer; and
a MOSFET device comprising:
  a second gate electrode;
  a third current carrying electrode electrically coupled to the first gate electrode; and
  fourth current carrying electrode electrically coupled to the first internal conductor structure.

5. The structure of claim 4, wherein the first internal conductor structure comprises:
a first conductor within the barrier layer;
a second conductor extending from the first conductor to the base substrate; and
an insulator between the second conductor layer and the channel.

6. The structure of claim 5, wherein:
the MOSFET device comprises a separate device stacked onto the depletion mode HEMT device; and
the MOSFET device comprises a silicon substrate having opposing first and second major surfaces.

7. The structure of claim 6, wherein:
the second gate electrode and the third current carrying electrode are disposed adjacent the first major surface of the silicon substrate;
the fourth current carrying electrode is disposed adjacent the second major surface of the silicon substrate; and
the fourth current carrying electrode is attached to the first current carrying electrode.

8. The structure of claim 7 further comprising:
a package substrate having a die pad and a plurality of leads, wherein:
the second current carrying electrode is attached to the die pad;
the first gate electrode is attached to a first lead;
the second gate electrode is electrically coupled to a second lead; and
the third current carrying electrode is electrically coupled to the first lead.

9. The structure of claim 8 further comprising:
a third lead electrically coupled to the die pad; and
an encapsulant enclosing the depletion mode HEMT device, the MOSFET device and at least portions of the first lead and at least portions of the second lead.

10. The structure of claim 6, wherein:
the second gate electrode and the third current carrying electrode are disposed adjacent the first major surface of the silicon substrate;
the fourth current carrying electrode is disposed adjacent the second major surface of the silicon substrate; and
the fourth current carrying electrode is attached to the second current carrying electrode.

11. The structure of claim 10 further comprising:
a package substrate having a die pad and a plurality of leads, wherein:
the first current carrying electrode is attached to the die pad;
the first gate electrode is electrically coupled to a first lead;
the second gate electrode is electrically coupled to a second lead; and
the third current carrying electrode is electrically coupled to the first lead.

12. The structure of claim 11 further comprising:
a third lead electrically coupled to the die pad; and
an encapsulant enclosing the depletion mode HEMT device, the MOSFET device and at least portions of the first lead and at least portions of the second lead.

13. The structure of claim 4, wherein the MOSFET device is disposed within the base substrate.

14. A cascode semiconductor structure comprising:
a depletion mode HEMT device comprising:
  a base substrate of a first semiconductor material, wherein the base substrate forms a first current carrying electrode;
  a heterostructure comprising a III-nitride channel layer over the base substrate and a III-nitride barrier layer over the channel layer;
  a second current carrying electrode coupled to the barrier layer;
  a first gate electrode overlying a portion of the barrier layer and spaced apart from the second current carrying electrode; and a first internal conductor structure extending from the barrier layer through the channel layer to the base substrate, wherein the first internal conductor structure comprises a first conductor within the barrier layer, a second conductor extending from the first conductor to the base substrate, and an insulator between the second conductor layer and the channel; and a MOSFET device comprising:
a second gate electrode;
a third current carrying electrode electrically coupled to the first gate electrode; and
fourth current carrying electrode electrically coupled to the first internal conductor structure.

15. The structure of claim 14, wherein:
the MOSFET device comprises a separate device attached to the depletion mode HEMT device; and
the MOSFET device comprises a silicon substrate having opposing first and second major surfaces.

16. The structure of claim 15, wherein:
the second gate electrode and the third current carrying electrode are disposed adjacent the first major surface of the silicon substrate;
the fourth current carrying electrode is disposed adjacent the second major surface of the silicon substrate; and
the fourth current carrying electrode is attached to the second current carrying electrode, the structure further comprising:
a package substrate having a die pad and a plurality of leads, wherein:
the first current carrying electrode is attached to the die pad;
the first gate electrode is electrically coupled to a first lead;
the second gate electrode is electrically coupled to a second lead;
the third current carrying electrode is electrically coupled to the first lead; and
an encapsulant enclosing the depletion mode HEMT device, the MOSFET device and at least portions of the first lead and at least portions of the second lead.

17. The structure of claim 15, wherein:
the second gate electrode and the third current carrying electrode are disposed adjacent the first major surface of the silicon substrate;
the fourth current carrying electrode is disposed adjacent the second major surface of the silicon substrate; and
the fourth current carrying electrode is attached to the first current carrying electrode, the structure further comprising:
a package substrate having a die pad and a plurality of leads, wherein:
the second current carrying electrode is attached to the die pad;
the first gate electrode is attached to a first lead;
the second gate electrode is electrically coupled to a second lead;
the third current carrying electrode is electrically coupled to the first lead; and
an encapsulant enclosing the depletion mode HEMT device, the MOSFET device and at least portions of the first lead and at least portions of the second lead.

18. The structure of claim 14, wherein the MOSFET device further comprises:
a first doped region of a first conductivity type in the base substrate and spaced apart from the first internal conductor structure, wherein the first conductivity type is opposite to a conductivity type of the base substrate;
the second gate electrode overlying the first doped region, wherein a portion of the first doped region forms a channel region of the MOS transistor; and
a second internal conductor structure adjacent to but spaced apart from the first doped region, the second internal conductor structure extending from the barrier layer through the channel layer to the base substrate, wherein the second internal conductor is configured as part of the third current carrying electrode.

19. The structure of claim 14, wherein the MOSFET device further comprises:
a first doped region of a first conductivity type in the base substrate and abutting the first internal conductor structure, wherein the first conductivity type is opposite to a conductivity type of the base substrate, and wherein the fourth current carrying electrode comprises the first doped region;
a second doped region of the first conductivity type in the base substrate and spaced apart from the first doped region, wherein the third current carrying electrode comprises the second doped region;
the second gate electrode overlying a portion of the base substrate that is between the first and second doped regions, wherein the portion of the base substrate forms a channel region of the MOSFET device; and
a second internal conductor structure extending from the barrier layer through the channel layer to the second doped region, wherein the second internal conductor structure forms a low resistance electrical current path.

* * * * *